US010842007B2

(12) United States Patent
Teague

(10) Patent No.: US 10,842,007 B2
(45) Date of Patent: Nov. 17, 2020

(54) METHOD FOR PROACTIVE MITIGATION OF CORONAL DISCHARGE AND FLASH-OVER EVENTS WITHIN HIGH VOLTAGE X-RAY GENERATORS USED IN BOREHOLE LOGGING

(71) Applicant: Visuray Intech Ltd (BVI), Tortola (VG)

(72) Inventor: Philip Teague, Houston, TX (US)

(73) Assignee: Visuray Intech LTD (BVI), Tortola (VG)

( * ) Notice: Subject to any disclaimer, the term of this patent is extended or adjusted under 35 U.S.C. 154(b) by 112 days.

(21) Appl. No.: 15/956,495

(22) Filed: Apr. 18, 2018

(65) Prior Publication Data
US 2018/0240638 A1    Aug. 23, 2018

Related U.S. Application Data

(60) Provisional application No. 62/486,560, filed on Apr. 18, 2017.

(51) Int. Cl.
*H05G 1/32* (2006.01)
*H05G 1/26* (2006.01)
(Continued)

(52) U.S. Cl.
CPC .............. *H05G 1/32* (2013.01); *H01J 35/025* (2013.01); *H01J 37/09* (2013.01); *H01J 37/165* (2013.01);
(Continued)

(58) Field of Classification Search
CPC .. G01V 5/08; G21G 4/02; G21G 4/04; G21G 4/06; H05G 1/02; H05G 1/04; H05G 1/08; H05G 1/085; H05G 1/26; H05G 1/265; H05G 1/30; H05G 1/32; H01J 35/00; H01J 35/02; H01J 35/025; H01J 35/04; H01J 35/06; H01J 35/064; H01J 35/066; H01J 35/16; H01J 37/09; H01J 37/16; H01J 37/165; H01J 37/24; H01J 37/241;
(Continued)

(56) References Cited

U.S. PATENT DOCUMENTS 2,040,156 A * 5/1936 Slack ...................... H01J 35/12
378/141
4,126,803 A * 11/1978 Bader ...................... H01J 35/16
378/121
(Continued)

*Primary Examiner* — Anastasia Midkiff
(74) *Attorney, Agent, or Firm* — Raymond R. Ferrera; Adams and Reese LLP

(57) ABSTRACT

A control mechanism for a high-voltage generator that provides voltage and current to an electronic radiation source in a high-temperature environment is provided, the control mechanism including at least an intermediate enveloping ground plane, and a ground-plane potential monitoring system that provides an input to a control processor that in turn drives the high-voltage generator. A method of controlling a high-voltage generator that powers an electronic radiation source is also provided, the method including at least: measuring an enveloping ground plane potential such that a change in the potential of said enveloping ground plane surrounding the generator is monitored and used to determine the beginning of one or more of a partial discharge and flash-over event.

10 Claims, 1 Drawing Sheet

(51) Int. Cl.
*H01J 37/24* (2006.01)
*H01J 37/09* (2006.01)
*H01J 35/02* (2006.01)
*H01J 37/16* (2006.01)

(52) U.S. Cl.
CPC .......... *H01J 37/241* (2013.01); *H05G 1/265* (2013.01); *H01J 2235/168* (2013.01); *H01J 2237/0206* (2013.01)

(58) Field of Classification Search
CPC ................ H01J 37/248; H01J 2235/16; H01J 2235/165; H01J 2235/168; H01J 2237/0203; H01J 2237/0206; H01J 2237/0216; H01J 2237/03; H01J 2237/038; H01J 2237/2485
See application file for complete search history.

(56) References Cited

U.S. PATENT DOCUMENTS 4,694,480 A * 9/1987 Skillicorn ............... H01J 35/12
378/102
2017/0251545 A1* 8/2017 Klinkowstein .......... H05G 1/06

\* cited by examiner

METHOD FOR PROACTIVE MITIGATION OF CORONAL DISCHARGE AND FLASH-OVER EVENTS WITHIN HIGH VOLTAGE X-RAY GENERATORS USED IN BOREHOLE LOGGING

TECHNICAL FIELD

The present invention relates generally to methods and means to pre-emptively detect unwanted discharge events within a high voltage generator of an electronic ionizing radiation source, such as within the domain of oil and gas well logging, and in a specific though non-limiting embodiment to methods and means for detecting probable electronic discharge events before they reach a level that could damage a high voltage generator or electronic ionizing radiation source, such as a pulse-neutron generator or x-ray tube.

BACKGROUND

Various means have been attempted to replace the chemical sources used in borehole logging tools for electronic ionizing radiation producing devices. Typically, when a discharge event occurs within the associated high-voltage generator or the source tube, a substantial surge of electrons leaving either the generator or tube via a path outside the design parameters will typically result. Consequently, a substantial surge of electrons (similar to atmospheric lightning) that either permanently damages the insulation materials used in the generator or tube assemblies, and/or damages the electronic componentry of the generator as the surge potentials and currents far exceed the design parameters of the components can occur.

Certain prior art discloses methods and means to limit either the effect of the discharges when they occur, or to inhibit through design the probability that such a discharge will occur. In the former case, one common method is to reduce the overall capacitance of the system to the minimum degree necessary for operation of the generator, such that the abundance of electrons in the system is minimized, so that the level/power of the discharge is minimized. Another method is to actively monitor the consumed current of the overall system, such that if an increase in consumed current is detected (other than as a result of a control input) then the associated electrons are likely being consumed by the beginning of a discharge event. In the latter case, more insulating material is used during design, and/or larger diameter housings are implemented in an attempt to reduce the maximum electrical field gradient between the high voltage apparatus and the ground plane or insulate against the movement of electrons. However, housing diameters are very narrow within borehole logging, and the opportunity to solve the discharge issue through use of large housing diameters, or the application of large quantities of electric insulator alone is not a possibility.

No prior art discloses practical methods and means to proactively monitor the formation of discharges such that the generator control inputs can be modified temporarily so that the valence of electrons in the generator or overall system can be temporarily suppressed using control inputs to inhibit the continuation of formation of the discharge path.

U.S. Pat. No. 6,118,639 to Goldstein discloses a fast acting disconnect system incorporated with a transient voltage surge suppressor to protect the surge suppressor and connected utilization equipment from power frequency over-voltages. The reference also discloses a resettable circuit breaker that permits reconnection after disconnecting the AC voltage source due to a power frequency overvoltage.

U.S. Pat. No. 5,023,768 to Collier discloses a high voltage, high power DC power supply that includes a single turn primary winding driven through a resonating capacitor by an AC source having a frequency in excess of about 100 kHz. The primary winding includes a pair of concentric cylindrical metal walls having opposite ends electrically connected to each other. A volume between the walls includes plural secondary winding assemblies, having different axial positions along the walls. Each of the assemblies includes an annular magnetic core surrounding the interior wall, a winding on the core and a voltage-doubling rectifier. DC voltages developed across each secondary winding assembly by the rectifier are added together to provide the high voltage, high power output.

U.S. Pat. No. 7,102,868 to Montena discloses an electrically conductive element for protecting electrical components positioned within a cable connector or cable terminator from high voltage surges, including a ring that is positioned in circumferentially surrounding relation to the input pin of the connector or terminator that carries the signal being transmitted by the coaxial cable. The ring includes at least one prong that extends radially inward therefrom, which terminates in close but non-contacting relation to the input pin. When a high voltage surge of electricity is carried by the coaxial cable transmission line, a spark is formed in the gap between the prong and the cable connector or terminator. As a consequence, the high voltage surge is transferred to the surge protection element, which in turn conducts the electricity to the grounded body of the connector or terminator.

U.S. Pat. No. 5,400,385 to Blake et al. discloses a supply for a high bias voltage in an x-ray imaging system having an inverter and a voltage multiplier that produce an alternating output voltage in response to control signals. A voltage sensor produces a signal indicating a magnitude of the output voltage. A circuit determines a difference between the sensor signal and a reference signal that specifies a desired magnitude for the output voltage and that difference is integrated to produce an error signal. The error signal preferably is summed with a precondition signal that is an approximation of a nominal value for the signal sum and the summation producing a resultant signal. Another summation device arithmetically combines the resultant signal and the sensor signal with a signal corresponding to a one-hundred percent duty cycle of the inverter operation in order to produce a duty cycle command. An inverter driver generates the inverter control signals that have frequencies defined by the resultant signal and have duty cycles defined by the duty cycle command. A unique state machine is described which generates those control signals.

U.S. Pat. No. 4,641,330 Herwig et al. discloses a high voltage supply circuit for an x-ray tube including a high voltage transformer having a primary side driven by voltage pulses generated by a drive circuit. The drive circuit includes sub-circuits for controlling the pulse repetition frequency, which is selected as equal to a parallel resonant frequency of a high voltage generator connected to the secondary side of the transformer, for the purpose of saving energy. The drive circuit also includes a sub-circuit for controlling the pulse duration, with the filament voltage in the x-ray tube being regulated by this pulse duration.

U.S. Pat. No. 3,578,970 to Michard et al. discloses a variable width corona discharge apparatus for applying an electrostatic charge to a transverse dimension of variable width and position of the surface of strip material moving relative to the apparatus. One embodiment includes a movable shield adapted to mask the corona discharge wires along a predetermined portion of their length. Another embodiment includes a torque biased rotatable element transversely movable relative to the strip material and adapted to wind up the corona discharge wire along a predetermined portion of its length.

U.S. Pat. No. 7,564,948 to Wraight et al. discloses an x-ray source being used as a replacement for a chemical source during density logging along with various means of arranging the apparatus and associated power-supply, and also teaches of the means of filtering the primary beam from the x-ray source such that a filtered dual-peak spectrum can be detected by a reference detector which is then used to directly control (feedback) the x-ray tube voltage and current for stability purposes. However, the reference only discloses a compact x-ray device (bipolar) with a grid, a power supply which is a Cockroft-Walton rolled up into a cylinder (between two Teflon cylinders) to save space, and the aforementioned filtered reference detector method.

U.S. Pat. No. 8,481,919 to Teague teaches methods and means of creating and controlling the electrical power necessary by serially stepping up the DC reference and creating high potential field control surfaces, to control either a bipolar or unipolar x-ray tube for the purposes of replacing chemical sources in reservoir logging. Teague also teaches of moveable/manipulateable beam hardening filters and rotating light-house collimation on the source, the use of gaseous insulators including SF6 as an electrical insulator in a downhole x-ray generator.

SUMMARY

A control mechanism for a high-voltage generator that provides voltage and current to an electronic radiation source in a high-temperature environment is provided, the control mechanism including at least an intermediate enveloping ground plane, and a ground-plane potential monitoring system that provides an input to a control processor that in turn drives the high-voltage generator.

A method of controlling a high-voltage generator that powers an electronic radiation source is also provided, the method including at least: measuring an enveloping ground plane potential such that a change in the potential of said enveloping ground plane surrounding the generator is monitored and used to determine the beginning of one or more of a partial discharge and flash-over event.

BRIEF DESCRIPTION OF SEVERAL EXAMPLE EMBODIMENTS

The methods and means described herein enable the efficient and stable use of ultra-high voltage generators and electronic radiation sources within the high-temperature environment of a borehole. A control mechanism for a high-voltage generator that powers an electronic radiation source in high-temperature environments is provided, the tool including at least an intermediate ground potential monitoring system, providing an input to a control processor that in turn drives the high-voltage generator.

Figure 1:
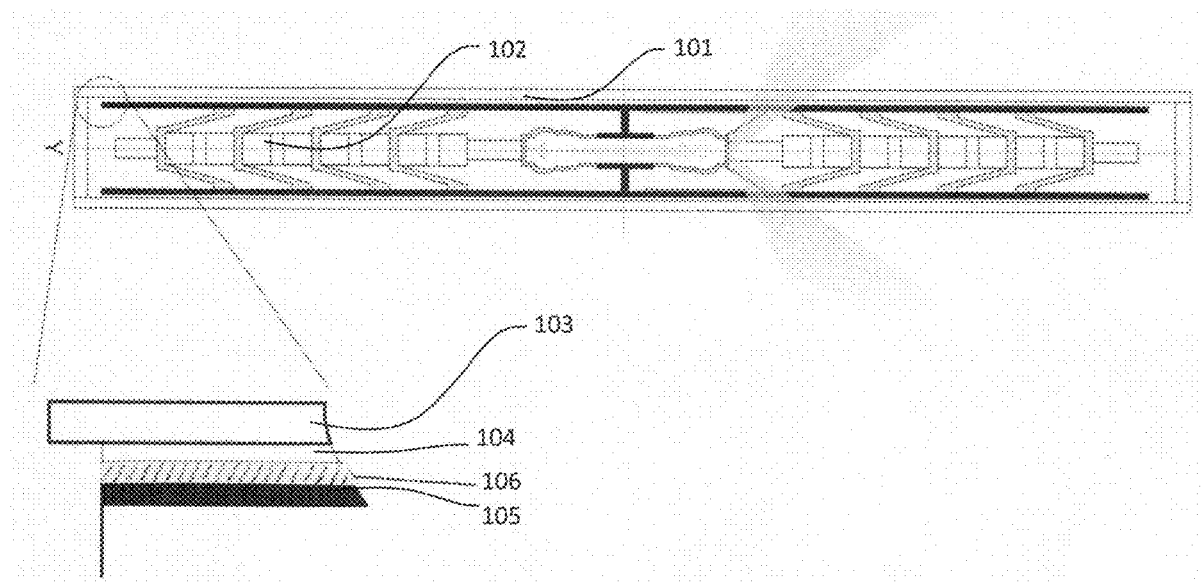
FIG. 1 illustrates a narrow format high-voltage generator enclosed within an intermediate ground-potential tube that is electrically insulated from the tool-housing (earth-ground potential), except for an electrical connection, though a measurement resistor that can be used to monitor current flow between the intermediate ground and the tool ground.

With reference now to the attached Figures, FIG. 1 illustrates a high-voltage generator assembly [102] located within a downhole tool pressure housing [101] electrically connected to the well-fluids and the armored cable of the wireline system, consequently, the electrical potential of the earth. An intermediate rotationally symmetrical ground plane enclosure [105] envelopes a high voltage supply [102] of an electronic ionizing radiation source. Said intermediate ground plane [105] is electrically insulated [104] from the tool-housing ground plane [103] whose reference potential is that of the tool housing and earth, by use of an electrical insulation material, such as Kapton or Teflon. By placing a measurement resistor [106] between the intermediate [105] and tool [101, 103] ground planes. any differences in electrical potential may be measured.

Figure 2:
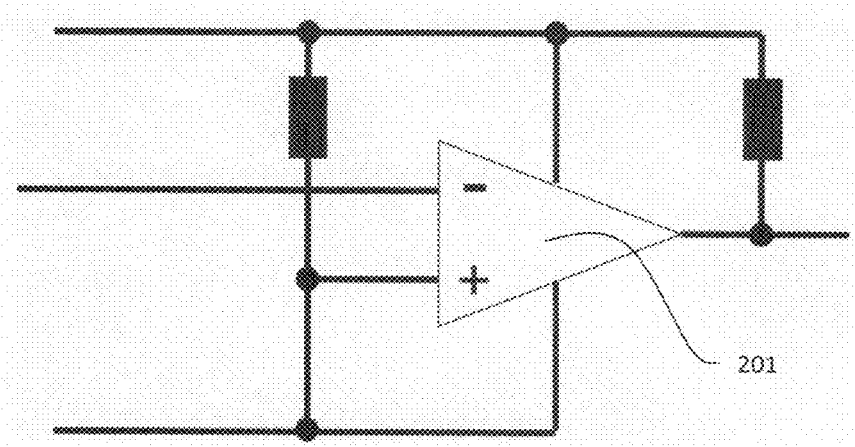
FIG. 2 illustrates one embodiment of an amplification circuit that could be used to amplify minor changes in the intermediate ground potential, resulting in a larger potential change used as a control input for a high-voltage generator drive circuitry.

FIG. 2 illustrates a circuit that could be used to amplify and detect any differences between the intermediate [105] and tool [101, 103] ground planes. The measured potential difference between the intermediate ground plane [105] and the grounded tool housing [101, 103] can be measured through a measurement resistor to provide input to a comparator [201]. In the event that the intermediate ground plane's [105] potential increases compared to the reference outer tool housing [101, 103] potential, due to discharges from the high voltage generator [102] or the electronic radiation source to the surrounding ground-plane [105], then the increase in plane [105] potential (or rate of increase) can be used as a control input to the high-voltage generator's power supply controller to temporarily shut-down or reduce the input voltages until the discharge potential has abated, thereby reinstating the high-voltage generator's setup point that was operating prior to the start of the discharge or flash-over event.

In one example embodiment, a high-voltage generator [102] driving of an electronic ionizing radiation source is surrounded by a rotationally symmetrical ground plane enclosure [105]. Said ground plane is electrically insulated from an outer ground plane [103], the reference potential of which is that of the tool housing [101]. By placing a measurement resistor between the inner and outer ground planes, the difference in electrical potential may be measured. The measured potential difference between the inner high-voltage enclosure's ground plane [105] and an outer grounded tool housing can be measured through a measurement resistor to provide input to a comparator [201]. In the event that the inner high-voltage ground plane's potential increases compared to the reference outer tool housing potential, due to discharges from the high voltage supply to the surrounding ground-plane or from discharges from the electronic radiation source to the surrounding ground-plane, then increase in the intermediate plane [105] potential (or rate of change) can be used as a control input to the high-voltage generator's controller to temporarily shut-down or reduce the input voltages until the discharge condition has abated.

In another example embodiment, the entire enclosure is filled with Sulphur Hexafluoride (SF6) gas, to be used as an electrical insulator for the high-voltage system.

In a further embodiment, the intermediate/inner ground plane is machined on its outer diameter to create recesses in which electrical conductors (bypass/control wires) are passed, and then over-wrapped with an insulating material, such as Kapton, to maintain electrical isolation from the primary outer tool housing.

In a still alternative embodiment, the means of detection of potential differences is a hot-cathode (in vacuum) device, such as a high-vacuum gauge, such a device may also operate as an incidental comparator, in respect to the dependency on a very stable ground reference for operation. In the event the ground plane potential increases due to electrons streaming from the high-voltage apparatus to the enveloping ground plane, the result will manifest as a false reading of rapidly changing vacuum level.

In example embodiments, the beginning of a discharge event is pre-empted by the minimal flow of electrons between the high voltage generator and the surrounding ground plane. Such flow would occur until a sufficient ionization path has developed between the high voltage apparatus and the ground plane to permit a significant discharge of electrons (flash-over), which could result in permanent damage to the high voltage componentry or the electronic ionizing radiation tube. The initial condition prior to such a discharge event would be a stream of electrons between the high voltage apparatus and the ground plane that would increase in magnitude. The effect would be a change in potential of the enveloping ground plane, the detection of which could pre-empt a substantial discharge by some seconds. This delay between the beginning of the discharge condition and the final substantial discharge is used as an opportunity to control the high voltage generator to either shut-down or reduce its output until the pre-discharge condition has abated (i.e., the inner ground plane potential has returned to its pre-discharge potential, being similar to that of the overall reference tool ground potential).

One benefit of such an arrangement is that the generator is designed to fit in a smaller diameter ground plane housing, as potential discharges can be pre-emptively controlled and mitigated, thereby reducing the diameter of the overall downhole tool for the same high-voltage rating.

Another benefit is that the probability of damage to the generator or source tube assemblies and/or components is greatly reduced, such that the lifetime/survivability of the overall system is increased.

In one example embodiment, the electronic radiation source being protected by the method is an electronic x-ray source.

In another example embodiment, the electronic radiation source being protected by the method is an electronic pulsed-neutron generator source.

The invention claimed is:

1. A control mechanism for, a high-voltage generator that provides voltage and current to an electronic radiation source in a high-temperature environment, said control mechanism comprising:

an intermediate enveloping ground plane; and
a ground-plane potential monitoring system that provides an input to a control processor that in turn drives the high-voltage generator.

2. The control mechanism of claim 1, wherein said mechanism is configured to modify the drive of the high voltage generator to shut-down or reduce the input power of the generator in the event of a detected coronal discharge or flash-over event from the generator to the enveloping ground-plane.

3. The control mechanism of claim 1, wherein said mechanism is configured to modify the drive of the high voltage generator to shut-down or reduce the input power of the generator in the event of a detected coronal discharge or flash-over event from the electronic radiation source to the enveloping ground-plane.

4. The control mechanism of claim 1, wherein the electronic radiation source is an x-ray source.

5. The control mechanism of claim 1, where the electronic radiation source is a pulsed neutron source.

6. A method of controlling a high-voltage generator that powers an electronic radiation source, said method comprising;

measuring an enveloping ground plane potential with a monitoring system, such that a change in the potential of said enveloping ground plane surrounding said generator is monitored, and wherein output from said monitoring system is sent to a processor to determine the beginning of one or more of a partial discharge and a flash-over event.

7. The method of claim 6, further comprising configuring the control mechanism to modify the drive of the high voltage generator to shut-down or reduce the input power of the generator in the event of one or, more of a detected coronal discharge and a flash-over event from the generator to the enveloping ground-plane.

8. The method of claim 6, further comprising configuring the control mechanism to modify the drive of the high voltage generator to shut-down or reduce the input power of the generator in the event of one or more of a detected coronal discharge and a flash-over event from the electronic radiation source to the enveloping ground-plane.

9. The method of claim 6, further comprising controlling a high-voltage generator that powers an x-ray source.

10. The method of claim 6, further comprising controlling a high-voltage generator that powers a pulsed neutron source.

* * * * *